United States Patent
Goundar

(10) Patent No.: US 7,632,549 B2
(45) Date of Patent: Dec. 15, 2009

(54) METHOD OF FORMING A HIGH TRANSPARENT CARBON FILM

(75) Inventor: Kamal Kishore Goundar, Kanagawa (JP)

(73) Assignee: ASM Japan K.K. (JP)

( * ) Notice: Subject to any disclaimer, the term of this patent is extended or adjusted under 35 U.S.C. 154(b) by 0 days.

(21) Appl. No.: 12/115,386

(22) Filed: May 5, 2008

(65) Prior Publication Data

US 2009/0274851 A1 Nov. 5, 2009

(51) Int. Cl.
  H05H 1/24 (2006.01)
  C23C 16/44 (2006.01)
(52) U.S. Cl. .................. 427/569; 427/488; 438/780
(58) Field of Classification Search .......... 427/569; 438/780
  See application file for complete search history.

(56) References Cited

U.S. PATENT DOCUMENTS

| | | | |
|---|---|---|---|
| 4,913,994 | A | 4/1990 | Osawa et al. |
| 5,169,407 | A | 12/1992 | Mase et al. |
| 5,470,661 | A | 11/1995 | Bayley et al. |
| 5,846,859 | A | 12/1998 | Lee |
| 5,869,135 | A | 2/1999 | Vaeth et al. |
| 6,428,894 | B1 | 8/2002 | Babich et al. |
| 6,813,534 | B2 | 11/2004 | Sui et al. |
| 7,410,915 | B2 * | 8/2008 | Morisada et al. ........... 438/780 |
| 7,504,344 | B2 | 3/2009 | Matsuki et al. |
| 2003/0097987 | A1 | 5/2003 | Fukuda |
| 2006/0084280 | A1 | 4/2006 | Matsuki et al. |
| 2006/0246731 | A1* | 11/2006 | Nishida .................. 438/706 |
| 2006/0275931 | A1 | 12/2006 | Takizawa et al. |
| 2007/0218705 | A1 | 9/2007 | Matsuki et al. |

FOREIGN PATENT DOCUMENTS

JP 63-014422 1/1988
WO WO 00/03421 1/2000

OTHER PUBLICATIONS

Morisada et al., Method of Forming a Carbon Polymer Film Using Plasma CVD, U.S. Appl. No. 11/853,273, filed Sep. 11, 2007.
Takizawa et al., Technology of Detecting Abnormal Operation of Plasma Process, U.S. Appl. No. 12/266,326, filed Nov. 6, 2008.

* cited by examiner

Primary Examiner—Shamim Ahmed
(74) Attorney, Agent, or Firm—Knobbe Martens Olson & Bear LLP

(57) ABSTRACT

A method of forming a transparent hydrocarbon-based polymer film on a substrate by plasma CVD includes: introducing a main gas consisting of a hydrocarbon gas ($C_\alpha H_\beta$, wherein $\alpha$ and $\beta$ are natural numbers) and an inert gas at a flow ratio (R) of $C_\alpha H_\beta$/inert gas of 0.25 or less into a CVD reaction chamber inside which a substrate is placed; and forming a hydrocarbon-based polymer film on the substrate by plasma polymerization of the gas at a processing temperature (T) wherein $T \leq (-800R + 500)$.

14 Claims, 5 Drawing Sheets

METHOD OF FORMING A HIGH TRANSPARENT CARBON FILM

BACKGROUND OF THE INVENTION

1. Field of the Invention

The present invention relates to a method of forming a carbon polymer film by plasma CVD using a hydrocarbon-containing material having a high molecular weight, and more particularly to a method of utilizing the carbon polymer film, for example, as a hard mask for semiconductor processing.

2. Description of the Related Art

In semiconductor processing techniques, optical films such as antireflective films and hard masks are used. In conventional techniques, these films are formed mainly by a technique called a coating method. The coating method forms highly functional polymer films by coating a liquid material and sintering it. It is, however, difficult to form a thin film on a substrate because a liquid having high viscosity is coated. As semiconductor chip sizes continue to shrink, more thinned, high-strength and high transparent films are required.

As an advantageous method for achieving formation of such films, formation of a DLC diamond-like carbon film or an amorphous carbon film by plasma CVD has been reported (e.g., U.S. Pat. No. 5,470,661, U.S. Pat. No. 6,428,894). In these cases, using a molecule which is gaseous at room temperature as a material, a diamond-like carbon film or an amorphous carbonous film is formed by decomposing the molecule by plasma. Using a plasma CVD method is promising for facilitating formation of thinner films.

SUMMARY OF THE INVENTION

Polymer materials produced from organic monomers having high molecular weights (e.g., having five or more carbon atoms) such as benzene can actualize wide varieties of structures and characteristics and can be widely and industrially used as high-strength materials and various highly-functional materials. By plasma polymerizing these organic monomers (e.g., by including them in reaction gas as a source gas), it becomes possible to form a thin-film hard mask having excellent characteristics.

In the above, in CVD where the liquid monomer having a benzene structure is used, a stable polymer having a density of about 0.9 to about 1.2 $g/cm^3$ and an extinction coefficient of about 0.1 to about 0.15 at a lighting optical wavelength of 633 nm can be formed by sufficiently incorporating the benzene structure into the polymer structure. However, in that case, because the benzene structure which is a porous structure constitutes a basal structure, it is difficult to form a polymer having a density of more than 1.2 $g/cm^3$ and an extinction coefficient of less than 0.05 at a lighting optical wavelength of 633 nm.

In the disclosure embodiments of the present invention, by using a hydrocarbon monomer being unsaturated and having no benzene structure, a high density carbon polymer having a density of more than 1.2 $g/cm^3$ (e.g., 1.3 $g/cm^3$ or higher) can be formed. The forming polymer can have optical properties such as a refractive index (n) of 1.6 or higher (preferably 1.65 or 1.70 or higher) and an extinction coefficient (k) of 0.1 or lower (preferably 0.05 or lower) at a lighting optical wavelength of 633 nm. Due to the high density and low extinction coefficient of the polymer film, etching selectivity and alignment performance can be significantly improved.

In an aspect, the disclosure embodiments of the present invention include a method of forming a transparent hydrocarbon-based polymer film on a substrate by plasma CVD, comprising: (i) introducing a main gas consisting of a hydrocarbon gas ($C_\alpha H_\beta$, wherein $\alpha$ and $\beta$ are natural numbers) and an inert gas at a flow ratio (R) of $C_\alpha H_\beta$/inert gas of 0.25 or less into a CVD reaction chamber inside which a substrate is placed; and (ii) forming a hydrocarbon-based polymer film on the substrate by plasma polymerization of the gas at a processing temperature (T° C.) wherein $T \leq (-800R+500)$. T and R are adversely related. In an embodiment, the temperature may be 400° C. or lower.

In another aspect, the disclosure embodiments of the present invention include a method of forming a hydrocarbon-containing polymer film on a semiconductor substrate using a capacitively-coupled plasma CVD apparatus, which comprises: (i) vaporizing a hydrocarbon-containing liquid monomer ($C_\alpha H_\beta$, wherein $\alpha$ and $\beta$ are natural numbers of 5 or more) having a boiling point of about 20° C. to about 350° C., said liquid monomer being unsaturated and having no benzene structure; (ii) introducing said vaporized gas into a CVD reaction chamber inside which a substrate is placed; and (iii) forming a hydrocarbon-containing polymer film on said substrate by plasma polymerization of said gas.

In any of the foregoing embodiments, the liquid organic monomer may be a hydrocarbon monomer having five or more carbons and contains at least one unsaturated carbon bond. In an embodiment, the polymer is a polymer film formed on a semiconductor substrate, and no limitation is imposed on its intended use or purposes.

In any of the foregoing embodiments, as the liquid organic monomer, a monomer containing no unsaturated carbon bond can be used. In an embodiment, the liquid organic monomer consists of hydrocarbon and contains none of O, Si, F, and N in the monomer. In an embodiment, the source gas is exclusively the liquid organic monomer. In an embodiment, in addition to the liquid organic monomer, an inert gas and/or an additive gas are/is used.

Since most of monomers having high molecular weights have low vapor pressures and are liquid at room temperature, they need to be vaporized in order to introduce them into a reaction chamber. In an embodiment of the present invention, use of liquid monomers made it possible by inhibiting monomers from re-condensation by using a vaporizer for vaporizing the liquid monomers, and heating and keeping a given temperature gas piping extending from the vaporizer to a reactor and a shower plate inside a reaction space at.

Further, according to an embodiment of the present invention, after being introduced into the reaction chamber, the organic monomers are polymerized by a polymerization reaction by plasma to make it possible to form an organic carbon polymer film on a substrate surface, and it becomes possible to use the film formed as a hard mask for semiconductor processing. A carbon polymer film formed by plasma CVD has excellent characteristics as an optical film because it facilitates forming a thin film having transparency.

The present invention is not limited to the above-mentioned advantages, objects or embodiments. In the present invention, it is to be understood that not necessarily all such objects or advantages may be achieved in accordance with any particular embodiment of the invention. Thus, for example, those skilled in the art will recognize that the invention may be embodied or carried out in a manner that achieves or optimizes one advantage or group of advantages as taught herein without necessarily achieving other objects or advantages as may be taught or suggested herein.

BRIEF DESCRIPTION OF THE DRAWINGS

Figures are referred to when preferred embodiments of the present invention are described, but the present invention is not limited to these figures and embodiments. The figures are oversimplified for illustrative purposes and are not to scale.

DETAILED DESCRIPTION OF THE PREFERRED EMBODIMENT

Figure 1:
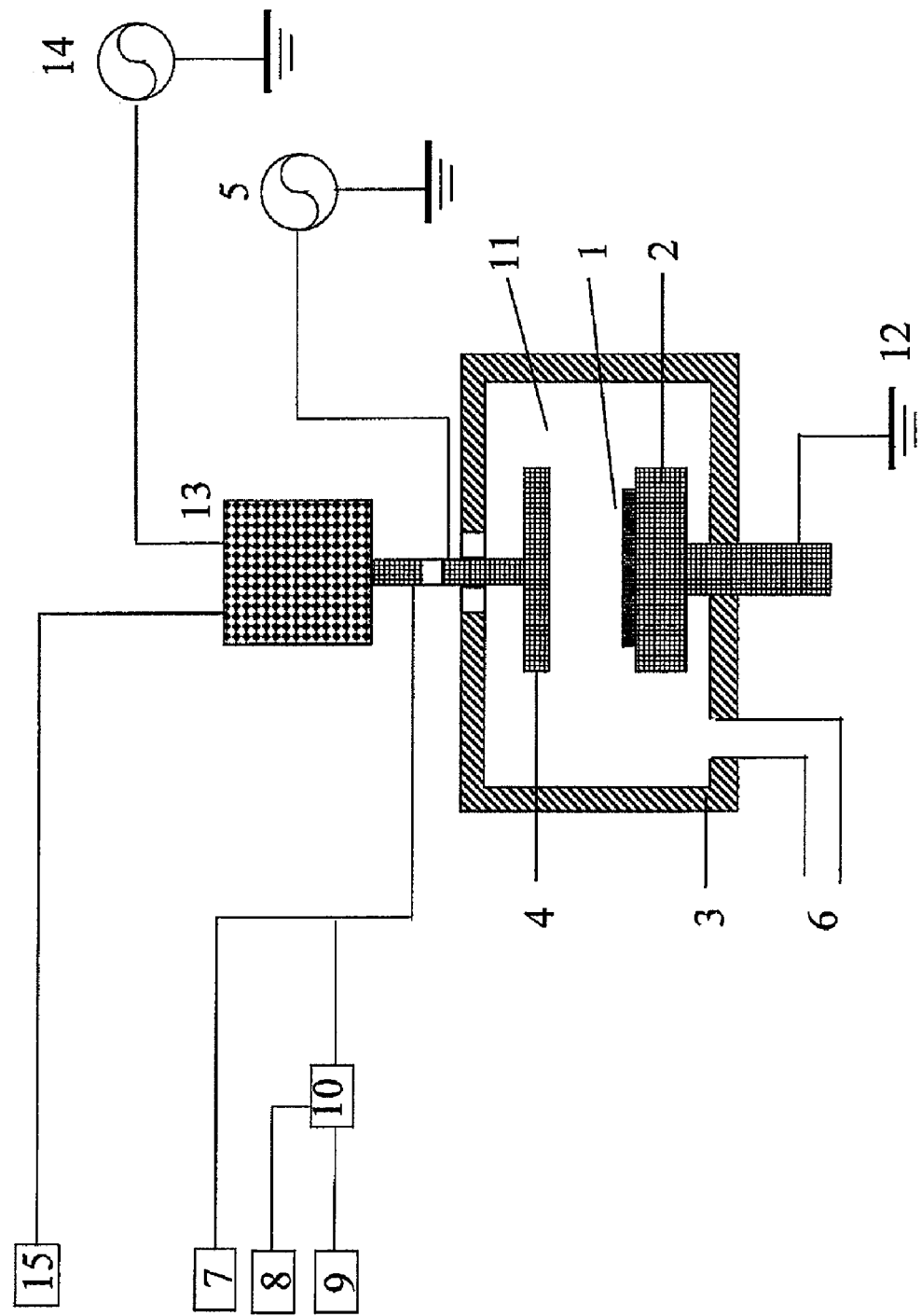
FIG. 1 is a schematic view showing an example of a CVD apparatus which can be used in an embodiment of the present invention.

The present invention is described in detail using preferred embodiments. The present invention, however, is not limited to these embodiments. Additionally, a requirement in an embodiment is freely applicable to other embodiments, and requirements are mutually replaceable unless mutually exclusive conditions are employed.

In a method of forming a hydrocarbon-containing polymer film on a semiconductor substrate using a capacitively-coupled plasma CVD apparatus, the disclosed embodiments provide the above-mentioned method which comprises: (i) vaporizing a hydrocarbon-containing liquid monomer ($C_\alpha H_\beta$, wherein $\alpha$ and $\beta$ are natural numbers of 5 or more); having a boiling point of about 15° C. to about 350° C., said liquid monomer being unsaturated and having no benzene structure; (ii) introducing said vaporized gas into a CVD reaction chamber inside which a substrate is placed; and (iii) forming a hydrocarbon-containing polymer film on said substrate by plasma polymerization of said gas. The substrate is, for example, a semiconductor device substrate.

In the above embodiment, the non-benzene liquid monomer may be cyclic, such as cyclopentane. In any of the foregoing embodiments, the liquid monomer may have a carbon/hydrogen ratio (C/H) of 0.4 or higher, preferably 0.5 or higher. As the liquid monomer, those disclosed in U.S. patent application Ser. No. 11/853,273 which is owned by the same assignee as in the present application can be used in an embodiment, the disclosure of which is incorporated herein by reference in its entirety.

In any of the aforesaid embodiments, only said non-benzene liquid monomer may be used as a reaction gas.

In any of the aforesaid embodiments, the non-benzene liquid monomer may be introduced into a vaporizer disposed upstream of said reaction chamber and vaporized. In the above, the non-benzene liquid monomer may be flow-controlled upstream of said vaporizer by a valve, and its introduction into said vaporizer may be blocked, except when a film is being formed, by a shutoff valve disposed between said flow control valve and said vaporizer and kept approximately at 50° C. or lower.

In any of the aforesaid embodiments, the method may further comprise introducing an inert gas into the reaction chamber prior to the plasma polymerization.

In any of the aforesaid embodiments, as an additive gas, an organic gas CnHm (wherein n is an integer of 4 or less including zero; m is any natural number) may further be introduced into the reaction chamber. In any of the aforesaid embodiments, as an additive gas, a dry gas containing any one or two or all of N, O, and F may further be introduced into the reaction chamber.

Additionally, according to another embodiment, in a method of forming a hydrocarbon-containing polymer film on a semiconductor substrate using a capacitively-coupled plasma CVD apparatus, the method comprises the steps of placing a semiconductor device substrate inside a CVD reaction chamber, vaporizing a hydrocarbon-containing liquid monomer ($C_\alpha H_\beta$, wherein $\alpha$ and $\beta$ are natural numbers of 5 or more) having a boiling point of 15° C. to 350° C. (which may or may not be substituted by a vinyl group or an acetylene group), introducing the vaporized gas into the CVD reaction chamber inside which the substrate is placed, and forming a hard mask composed of a hydrocarbon-containing polymer film on the substrate by plasma polymerizing the gas.

In one or more of the above-mentioned embodiments, the liquid monomer may be introduced into a vaporizer disposed upstream of the reaction chamber and vaporized. Additionally, the liquid monomer may be flow-controlled by a valve upstream of the vaporizer, and introduction of the liquid monomer into the vaporizer may be blocked by a shutoff valve disposed between the flow control valve and the vaporizer and kept at 80° C. or lower or at a temperature lower than that of vaporization by approximately 50° C. or more except when a polymerized material is formed. Or, the liquid monomer may be flow-controlled by a valve disposed upstream of the vaporizer and kept at 80° C. or lower or at a temperature lower than that of vaporization by approximately 50° C. or more, and at the same time introduction of the liquid monomer into the vaporizer may be blocked except when a polymerized material is formed.

In another embodiment, the liquid monomer has no benzene structure (i.e., no benzene, benzene derivatives, or benzene ring), and the non-benzene liquid monomer is effective in increasing a density of a polymer film. The non-benzene liquid monomer may be cyclic or non-cyclic. The non-benzene liquid monomer may be saturated or unsaturated. The non-benzene liquid monomer can be any one of the foregoing or any combination thereof. In one of preferred embodiments, the liquid monomer is a non-cyclic hydrocarbon-containing monomer having at least one reactive group such as an unsaturated carbon bond. An unsaturated carbon bond is preferred because a molecule having an unsaturated carbon bond has a higher ratio of carbon to hydrogen as compared with a molecule having no unsaturated carbon bond. In another embodiment, the unsaturated carbon enhances polymerization so as to increase film density. Thus, in an embodiment, a molecular having a high carbon content is preferred regardless of whether the molecular has a saturated or unsaturated bond.

Also in embodiments using any one of the above-mentioned valves, the liquid monomer may be mixed with an inert gas downstream of the valve and upstream of the vaporizer.

Additionally, in one or more of the above-mentioned embodiments, a step of introducing an inert gas may be performed before the plasma polymerization.

Apparatus Configuration

FIG. 1 is a schematic view of an apparatus combining a vaporizer and a plasma CVD reactor, which can be used in an embodiment of the present invention. An apparatus which can be used in the present invention is not limited to an example shown in FIG. 1. Any suitable apparatus can be used.

In this example, by providing a pair of electrically conductive flat-plate electrodes 4, 2 in parallel and facing each other inside a reaction chamber 11, applying RF power 5 to one side, and electrically grounding 12 the other side, plasma is excited between the electrodes. A temperature regulator is provided in a lower stage 2, and a temperature is kept constantly at a given temperature in the range of 0° C.-650° C. to regulate a temperature of a substrate 1 placed thereon. An upper electrode 4 serves as a shower plate as well, and reaction gas is introduced into the reaction chamber 11 through the shower plate. Additionally, in the reaction chamber 11, an exhaust pipe 6 is provided through which gas inside the reaction chamber 11 is exhausted. Further, numeral 13 refers to a remote plasma unit, numerals 14 and 15 refer to a remote plasma power source and a gas flow mass control unit, respectively.

A vaporizer 10 which vaporizes a liquid organic monomer has an inlet port for a liquid and an inlet port for an inert gas in an embodiment and comprises a mixing unit for mixing these gases and a unit for heating and/or cooling the mixture. In the embodiment shown in FIG. 1, an inert gas is introduced from an inert gas flow-controller 8 to the vaporizer 10; and a liquid monomer is introduced from a liquid monomer flow-controller 9 into the vaporizer 10. Storage/Processing temperature for the mixture is determined by a vapor pressure characteristic of the liquid monomer; in an embodiment, a temperature is kept in the range of 0° C.-350° C. (e.g., 15° C.-350° C.). Vaporized gas is introduced into the reactor through gas piping. Additionally, the embodiment shown in FIG. 1 is designed to be able to introduce an additive gas including an inert gas from a gas flow-controller 7 into the reactor. Additionally, an inert gas can also be introduced into the reactor without passing through the vaporizer 10. The number of the gas flow-controller 7 is not limited to one, but can be provided appropriately to meet the number of gas types used.

The piping introducing the gas from the vaporizer to the reactor and a showerhead unit in an upper portion of the reactor are temperature-controlled at a given temperature in the range of 15° C.-350° C. by a vaporizer and their outer side is covered by an insulating material.

As a liquid organic monomer used in an embodiment of the present invention as a source gas, a hydro-carbon containing liquid monomer having a boiling point of room temperature or higher which may or may not be substituted by the vinyl group. Preferably, the carbon number is above 5, in an embodiment the carbon number is between 5 and 12. Additionally, a boiling point is preferably approximately 15° C., and in still another embodiment, it is approximately 15° C. to approximately 100° C. The liquid monomer is a cyclic hydrocarbon in an embodiment. The cyclic hydrocarbon is not benzene.

Liquid Organic Monomer

As a liquid organic monomer used in an embodiment of the present invention as a source gas, a hydrocarbon-containing liquid monomer ($C_\alpha H_\beta$, wherein $\alpha$ and $\beta$ are natural numbers of 5 or more) having a boiling point of room temperature or higher (e.g., 15° C.-350° C.) which may or may not be substituted by a vinyl group or an acetylene group. Preferably, the carbon number is 5-30; in an embodiment, the carbon number is 5-12. Additionally, a boiling point is preferably approximately 15° C.-approximately 350° C.; in another embodiment, it is approximately 15° C.-approximately 200° C.; and in still another embodiment, it is approximately 15° C.-approximately 100° C. or higher. The liquid monomer is cyclic hydrocarbon in an embodiment. The cyclic hydrocarbon is not a benzene or benzene derivative.

The non-benzene liquid monomer may be cyclic, such as cyclopentane. In another embodiment, the non-benzene liquid monomer may be non-cyclic, such as $C_5H_8$. As the liquid monomer, a single species or two or more species in the species or two in various combinations can be used. In any of the foregoing embodiments the liquid monomer may have a carbon and hydrogen ratio of 0.45 or higher, preferably 0.5 or higher.

In the above embodiment, the non-benzene liquid monomer may be cyclic, such as cyclopentane. As the liquid monomer, a single species or two or more species in various combinations can be used. In any of the foregoing embodiments, the liquid monomer may have a carbon/hydrogen ratio (C/H) of 0.45 or higher, preferably 0.5 or higher. When the carbon/hydrogen ratio is high, the carbon content in ions or radicals generated by a plasma becomes high, thereby increasing the density of the forming polymer film which can serve as a carbon hard mask. For example, by using $C_5H_{10}$ ($\alpha=5$, $\beta=10$, C/H=0.5) instead of $C_5H_{12}$ ($\alpha=5$, $\beta=12$, C/H=0.416), a extinction coefficient (k) of the forming polymer film at a lighting optical wave length of 633 nm can be controlled from 0.005 to 0.1 at a lighting optical wave length of 633 nm, and a refractive index (n) of the forming polymer film can be controlled from 1.6 to 1.9. This may be because when the liquid monomer having a high C/H ratio is exposed to plasma, the state having a high C/H ratio can be maintained while forming a film, thereby increasing a density. Furthermore, the extinction coefficient decreases because it is strongly dependent on the deposition temperature. This maybe because when the temperature is reduced the film bonding structure is changed. More specifically, when reducing temperature more of diamond-like (sp3) bonds are formed that results in influencing the extinction coefficient. On the other hand when the temperature is increased more of the pure graphite-like (sp2) is developed which degrades the optical performances as a hardmask. Due to the high density and low extinction coefficient of the film, the etching selectivity and alignment performance can be improved.

Additionally, in another embodiment, a liquid organic monomer is a hydrocarbon-containing liquid monomer ($C_\alpha H_\beta$, wherein $\alpha$ and $\beta$ are natural numbers of 5 or more) having a boiling point of room temperature or higher (e.g., approximately 15° C.-approximately 350° C.). Using this monomer, a hard mask is formed. Preferably, the carbon number is 5-30; the carbon number is 5-12 in an embodiment. A boiling point is preferably approximately 15° C. to approximately 350° C.; it is 15° C. to approximately 350° C. in an embodiment; approximately 15° C. to approximately 200° C. in an embodiment. In an embodiment, the liquid monomer is cyclic hydrocarbon. Additionally, in an embodiment, the liquid monomer is a combination of two types or more of the non-substituted benzene.

Additionally, it may be linear hydrocarbon; the linear hydrocarbon may be pentane, iso-pentane, neo-pentane, hexane, 1-pentene, 1-hexene, or 1-pentyne.

In an embodiment, the hydrocarbon monomer containing at least one unsaturated carbon bond is $C_nH_{2(n-m)+2}$ (n is a natural number of 5 or greater, m is a natural number of 1 or greater but smaller than n). In an embodiment, a liquid material containing the liquid monomer with unsaturated carbon further contains 10 ppm to 1,000 ppm (e.g., 100 ppm to 600 ppm) of an inhibiter consisting of C, H and O such as t-butylcatechol, 2,6-di-tert-butyl-4-methylphenol, and dibutylhydroxytoluene (BHT), in order to inhibit the liquid monomer from being polymerized in a tank and/or pipes upstream of the reaction chamber. In still another embodiment, two or more hydrocarbon monomers containing at least one unsaturated carbon bond, each being expressed as $C_nH_{2(n-m)+2}$ (n is a natural number of 5 or greater, m is a natural number of 1 or greater but smaller than n), can be used in combination. In an embodiment, the liquid monomer can be a mixture of at least one cyclic hydrocarbon-containing compound such as those explained in this disclosure and at least one non-cyclic hydrocarbon-containing compound such as those explained in this disclosure.

In the above, examples include, but are not limited to, cyclopentane, $C_5H_{10}$ having a boiling temperature of 49° C. isoprene (2-methyl-1,3-butadiene), $CH_2=C(CH_3)CH=CH_2$ (i.e., $C_5H_8$), having a boiling temperature of 35° C. and cyclopentene, $C_5H_8$, having a boiling temperature of 46° C. Further, any one of organic monomers selected from the group consisting of 3-methyl-1,2-butadiene, 1,4-dimethyl-1,3-butadiene, and 1,2-dimethyl-1,3-butadiene, can be used as a source gas.

Flow Rate and Other Conditions

A flow rate of the liquid monomer is not particularly restricted, but as a flow rate introduced into a reaction chamber after vaporization, in an embodiment, it is approximately 30 sccm to approximately 1000 sccm (50 sccm, 100 sccm, 150 sccm, 200 sccm, 300 sccm, 400 sccm, 500 sccm, and including a range defined by any one of foregoing values).

Additionally, an inert gas can be introduced into a reaction chamber. For example, the inert gas can be one of or a combination of two or more of Ar, He, Ne, Kr, Xe, and $N_2$; preferably Ar and/or He. A flow rate of an inert gas introduced into a reaction chamber is approximately 0 sccm to approximately 5000 sccm (30 sccm, 50 sccm, 100 sccm, 150 sccm, 200 sccm, 300 sccm, 500 sccm, 1000 sccm, 2000 sccm, and including a range defined by any one of foregoing values).

In an embodiment where the liquid monomer is a non-benzene monomer, a flow rate of an inert gas introduced into a reaction chamber is approximately 0 sccm to approximately 20,000 sccm (100 sccm, 300 sccm, 500 sccm, 1,000 sccm, 2,000 sccm, 3,000 sccm, 4,000 sccm, 8,000 sccm, and including a range defined by any one of foregoing values).

In an embodiment, the ratio of a flow rate of the vaporized liquid monomer to a flow rate of the inert gas may be 0.01 to 0.25, preferably 0.2 or less, more preferably 0.1 or less (e.g., 0.02-0.07). By controlling the ratio, it is possible to control the optical properties such as extinction coefficient of the resultant carbon film, wherein the lower the ratio, the lower the extinction coefficient becomes, for example within the above range. The appropriate ratio also depends on the susceptor temperature which may be preferably 400° C. or lower in an embodiment.

Additionally, in an embodiment, further as an additive gas, an organic gas CnHm (wherein n is an integer of 4 or less including zero; m is any natural number) can also be introduced into a reaction chamber. Or, further as an additive gas, a dry gas containing any one or more or all of N, O, and F can also be introduced into a reaction chamber. Additionally, as a reducing gas, hydrogen, ammonia, carbon monoxide, etc. can also be used as an additive gas. A flow rate of an additive gas introduced into a reaction chamber is approximately 0 sccm to approximately 300 sccm (30 sccm, 50 sccm, 100 sccm, 150 sccm, 200 sccm, and including a range defined by any one of foregoing values). In an embodiment where the liquid monomer is a non-benzene monomer, a flow rate of an additive gas introduced into a reaction chamber is approximately 0 sccm to approximately 600 sccm (30 sccm, 50 sccm, 100 sccm, 150 sccm, 200 sccm, 500 sccm, and including a range defined by any one of foregoing values).

Consequently, in an embodiment, an organic carbon polymer film is formed using only a hydrocarbon-containing monomer and an inert gas. Or, the film may be formed using only a hydrocarbon-containing monomer. Additionally, only a hydrocarbon-containing monomer and an inert gas, or a hydrocarbon-containing gas, an inert gas and an additive gas can be used. Additionally, in an embodiment, a flow rate of a gas other than a hydrocarbon-containing monomer is less than that of the hydrocarbon-containing monomer (gaseous), preferably less than a half that of the hydrocarbon-containing monomer (gaseous). In an embodiment such that where the liquid monomer is a non-benzene monomer, a flow rate of a gas other than a hydrocarbon-containing monomer is more than that of the hydrocarbon-containing monomer (gaseous), preferably about 10 times that of the hydrocarbon-containing monomer (gaseous).

Additionally, in an embodiment in which an inert gas is mixed in a vaporizer, the inert gas may be introduced into a reaction chamber. Explanation of the above-mentioned inert gas to be introduced into the reaction chamber can apply to the inert gas as it is. In this case, in substitution for an inert gas introduced directly into the reaction chamber, an inert gas introduced through a vaporizer can be used. Additionally, an inert gas introduced directly into the reaction chamber and an inert gas introduced through the vaporizer can also be used together. In an embodiment, a flow rate of an inert gas introduced through the vaporizer is equal to or more than that of an inert gas introduced directly. Additionally, in an embodiment, the same type of inert gas is used for the one introduced through the vaporizer and the one introduced through the vaporizer; in another embodiment, different types of inert gases are used.

A plasma polymerization can be preformed in an embodiment under the conditions: a substrate temperature of approximately 0° C. to approximately 650° C. (including a range of 150° C.-450° C. and a range of 250° C.-400° C.), a reaction pressure of approximately 10 Pa-approximately 1500 Pa (including a range of 50 Pa-1000 Pa, a range of 100 Pa-900 Pa, and a range of 400 Pa-800 Pa in embodiments). In preferred embodiments, the temperature (measured as the susceptor temperature) may be 400° C. or less, more preferably 350° C.

As to RF power density, a plasma polymerization step is preformed under the conditions of: RF power density of approximately 0.01 W/cm$^2$-approximately 20 W/cm$^2$ (per substrate area) (including a range of 0.05-10 W/cm$^2$, a range of 1 -5 W/cm2, and a range of 0.5-5 W/cm$^2$ in embodiments).

Power per unit monomer is changed under various other conditions; a plasma polymerization step can be performed under the condition of 0.01-100 W/sccm (including a range of 0.05-50 W/sccm and a range of 3-20 W/sccm) in an embodiment; RF power can also be controlled per monomer unit flow rate. In another embodiment such that where the liquid monomer is a non-benzene monomer, a plasma polymerization step can be performed under the condition of 0.01-500 W/sccm (including a range of 1-100 W/sccm and a range of 3-50 W/sccm) in an embodiment.

Additionally, a plasma polymerization step can be performed using a frequency exceeding 5 MHz, e.g., any one of high RF frequency power of 13.56 MHz, 27 MHz or 60 MHz; further, in an embodiment, one of the foregoing high RF frequency power and low RF power of 5 MHz or less (including 2 MHz or less and 500 kHz or less) can be combined. In an embodiment, a ratio of low RF power is 50% or less, 30% or less, or 10% or less of high RF power.

A thickness of an organic polymer can be appropriately selected according to intended uses. In an embodiment, it is 50 nm-1500 nm or 100 nm-1000 nm.

When films are formed using liquid monomers having a C/H ratio of 0.5 or higher, having no benzene ring, the films can show significantly improved properties in terms of all of RI(n), extinction coefficient (k), density, modulus, and hardness. In embodiments, the films may have a RI(n) of 1.6 or higher (e.g., 1.60-2.00), an extinction coefficient (k) of 0.10 or lower (e.g., 0.001-0.05), a density of 1.30 or higher (e.g. 1.30-1.48), a modulus of 20 GPa or higher (e.g., 30-60 GPa), and a hardness of 4 or higher (e.g., 5-10 GPa).

Reactor Cleaning and After-Treatment

Additionally, after film formation on a substrate is completed, cleaning inner walls of a reaction chamber is desirable. For example, cleaning of a wall surface of the reaction chamber can be performed by introducing oxygen ($O_2$) and/or a mixture gas of CxFy (x and y are any natural numbers respectively) and an inert gas into the reaction chamber and generating plasma between electrodes; after film formation on a substrate is completed, cleaning of a wall surface of the reaction chamber can be performed by introducing a gas containing radical molecules containing O and/or F into the reaction chamber; or after film formation on a substrate is completed, cleaning of a wall surface of the reaction chamber can be performed by introducing a gas containing radical molecules containing O and/or F into a reaction chamber, generating plasma between electrodes.

Additionally, after cleaning a wall surface of the reaction chamber is completed, by introducing a reducing gas and reducing radical molecules into the reaction chamber and generating plasma between electrodes, removing fluoride on the wall surface of the reaction chamber can also be performed.

Additionally, during the process of cleaning a wall surface of the reaction chamber using fluorine based gas chemistry technique, fluorine based residue is likely to be generated on the wall surface of the reaction chamber. These unwanted residues can be removed by introducing such as that of a reduction gas and reduction radical molecules into the reaction chamber and generating plasma between electrodes.

Further, in order to improve mechanical strength of a film, heat curing of the film formed can be performed by combining UV and EB.

In the present disclosure where conditions and/or structures are not specified, the skilled artisan in the art can readily provide such conditions and/or structures, in view of the present disclosure, as a matter of routine experimentation.

Also, in the present disclosure, the numerical numbers applied in embodiments can be modified by ±50% in other embodiments, and the ranges applied in embodiments may include or exclude the endpoints.

Experimental Result

Examples of the disclosed embodiments are explained below, but the present invention is not limited to these examples.

Common conditions: Common conditions in respective examples are as follows: Eagle-12™ (ASM Japan) possessing a basic structure shown in FIG. 1 was used as a reactor. Additionally, in the case of these examples, although a liquid monomer was flow-controlled by a flow control unit in a liquid phase, an amount of gas introduced into a reactor was obtained by molar conversion from the flow rate of the liquid.

Reactor Settings
Temperature of upper electrode (shower plate): 180° C.
Temperature of reactor wall: 180° C.
Size of shower plate: φ325 mm
(Size of substrate: φ300 mm)
Gap between shower plate and susceptor: 16 mm The temperature of the vaporizer and that of the piping were selected based on the boiling point, the vaporizing pressure, etc. of the precursor used.

Figure 2:
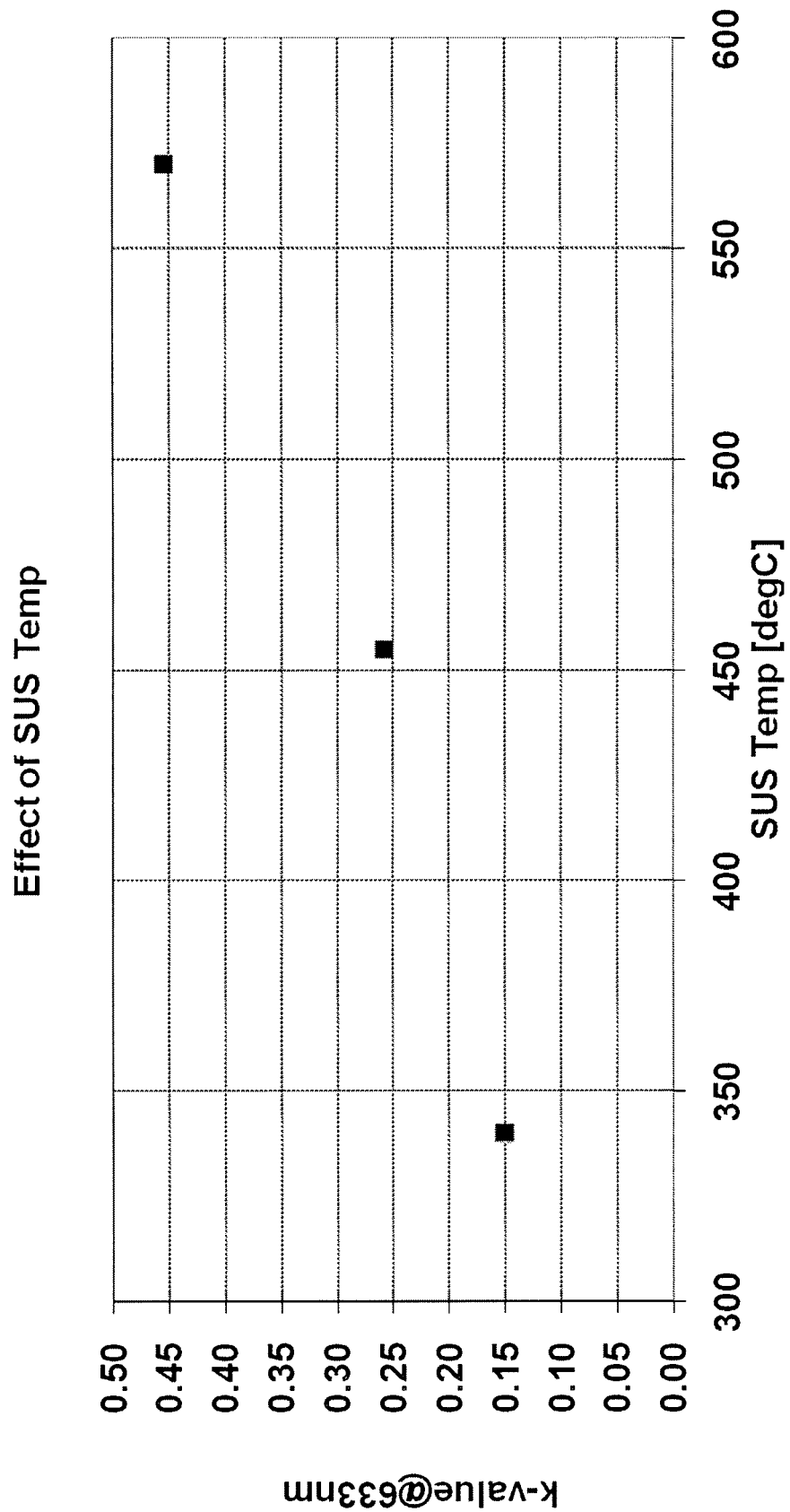
FIG. 2 is a graph showing an example of the relation between film optical properties and susceptor temperature in embodiments of the present invention.

Example 1: Process conditions in this example and film formation results are shown as follows:
Process Conditions:
Precursor: Cyclopentane: 200 sccm
He supplied to vaporizer: 500 sccm
Temperature of vaporizer, vaporizer portion: 40° C.
Controlled temperature of gas inlet piping: 80° C.
Process gas He supplied to reactor: 500 sccm
RF Power 13.56 MHz: 2300 W
Pressure: 733 Pa
Susceptor temperature: 575° C.
Film formation time: 43 sec
Film Formation Results:
Thickness: 200 nm
RI(n)@633 nm: 1.87
Extinction coefficient (k)@633 nm: 0.45 (see FIG. 2)
Density: 1.47 g/cm$^3$
Modulus: 52 GPa
Hardness: 7.9 GPa The film formed using cyclopentane (Example 1) shows fairly good physical properties. However, it has a poor optical performance.

Example 2: Process conditions in this example were the same as in Example 1 except for the susceptor temperature set to 455° C. The deposition time was set according to the target thickness of 200 nm.
Film Formation Results:
Thickness: 200 nm
RI(n)@633 nm: 1.80
RI(k)@633 nm: 0.25 (see FIG. 2)
Density: 1.44 g/cm$^3$
Modulus: 47 GPa
Hardness: 7.3 GPa The film formed using cyclopentane (Example 2) shows fairly good physical properties. However, it has a poor optical performance although it is better than in Example 1.

Example 3: Process conditions in this example were the same as in Example 1 except for the susceptor temperature set to 340° C. The deposition time was set according to the target thickness of 200 nm.
Film Formation Results:
Thickness: 200 nm
RI(n) @633 nm: 1.75
Extinction coefficient (k) @633 nm: 0.15 (see FIG. 2)
Density: 1.42 g/cm$^3$
Modulus: 43 GPa
Hardness: 7.1 GPa The film formed using cyclopentane (Example 3) shows fairly good physical properties. Also, it has a reasonable optical performance which is better than in Examples 1 and 2.

Figure 3:
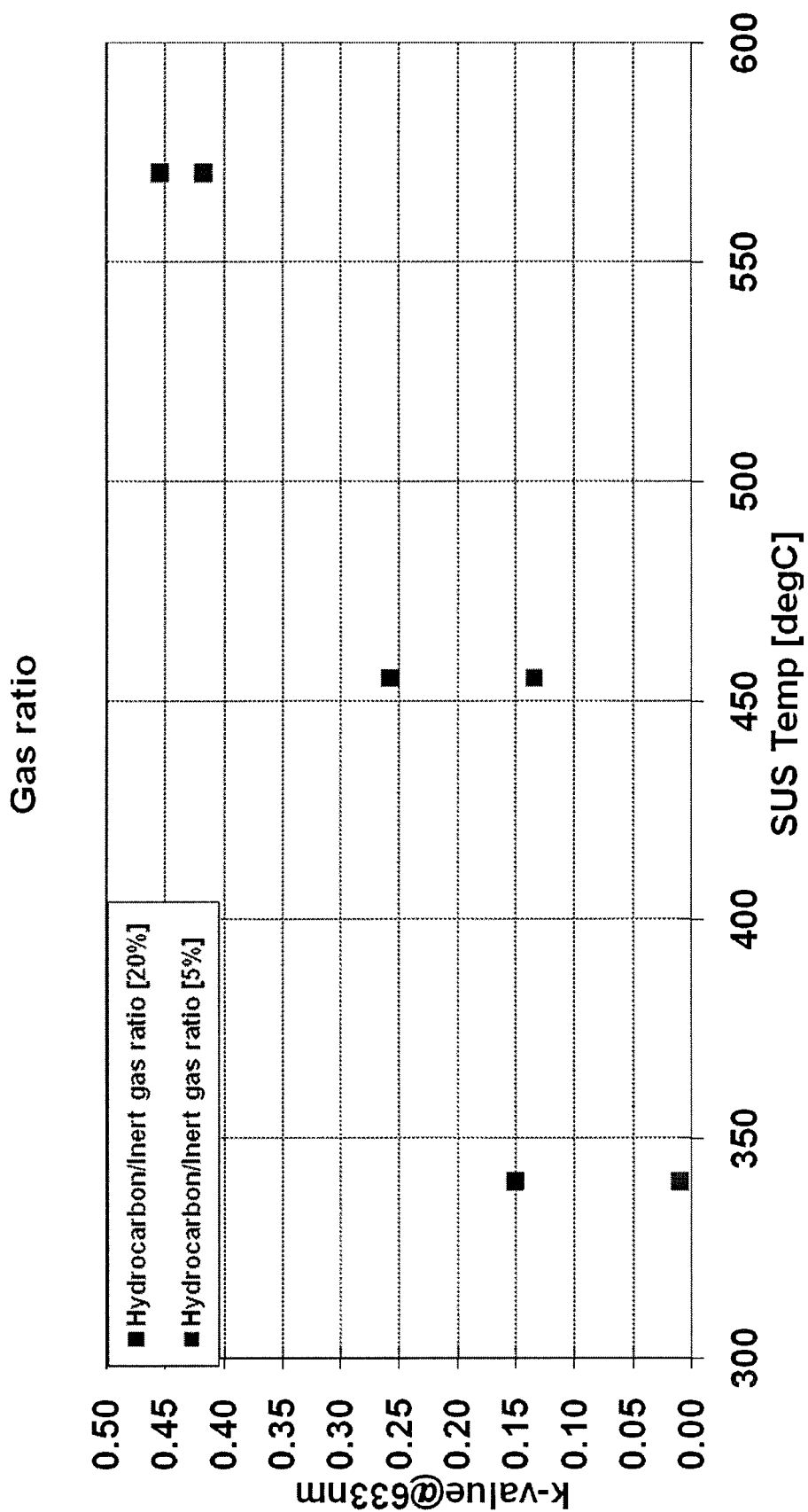
FIG. 3 is a graph showing an example of the relation between film optical properties and susceptor temperature at different hydrocarbon/inert gas ratios in embodiments of the present invention.

Example 4: Process conditions in this example were the same as in Examples 1 to Examples 3 except for the ratio of the hydrocarbon to inert gas changed from 0.2 to 0.05. The deposition time was set according to the target thickness of 200 nm.
Example 4-1
Film Formation Results at 575° C.
Thickness: 200 nm RI(n)@633 nm: 1.87
Extinction coefficient (k) @633 nm: 0.41 (see FIG. 3)
Density: 1.46 g/cm$^3$
Modulus: 49 GPa
Hardness: 7.6 GPa
Example 4-2
Film Formation Results at 455° C.
Thickness: 200 nm
RI(n)@633 nm: 1.78
Extinction coefficient (k) @633 nm: 0.13 (see FIG. 3)
Density: 1.44 g/cm$^3$
Modulus: 45 GPa
Hardness: 7.0 GPa
Example 4-3
Film Formation Results at 340° C.
Thickness: 200 nm
RI(n)@633 nm: 1.66
Extinction coefficient (k) @633 nm: 0.01 (see FIG. 3)
Density: 1.41 g/cm$^3$
Modulus: 40 GPa
Hardness: 6.8 GPa The films formed in Example 4-1 to 4-3 at a susceptor temperature of 340° C. show significantly better properties than those formed at other conditions, especially when the susceptor temperature was 340° C. (see FIG. 3).

Additionally, modulus, hardness of carbon polymer films obtained were all satisfactory and it is seen that the carbon polymer films obtained are suitable in terms of mechanical properties as for a hard mask. Furthermore, the absorption was also found to be low enough to allow a good alignment and an overlay measurement. As a result this tremendously suggests that above carbon polymer film is a reliable candidate as for a hard mask.

Example 5: Process conditions in this example were same as in Example 3 except for the ratio of the hydrocarbon to inert gas changed from 0.2 to 0.3. The deposition time was set according to the target thickness of 200 nm.

Film Formation Results at 340 deg C.:
Thickness: 200 nm
RI(n)@633 nm: 1.81
Extinction coefficient (k) @633 nm: 0.451 (see FIG. 4)
Density: 1.42 g/cm$^3$
Modulus: 45 GPa
Hardness: 7.2 GPa The film formed in Examples 5 at a susceptor temperature of 340° C. with a hydrocarbon/inert gas ratio of 30% shows significant degradation in optical film properties as compared with a ratio of 20% (Example 3) and that of 5% (Example 4-3) as shown in FIG. 4.

Figure 4:
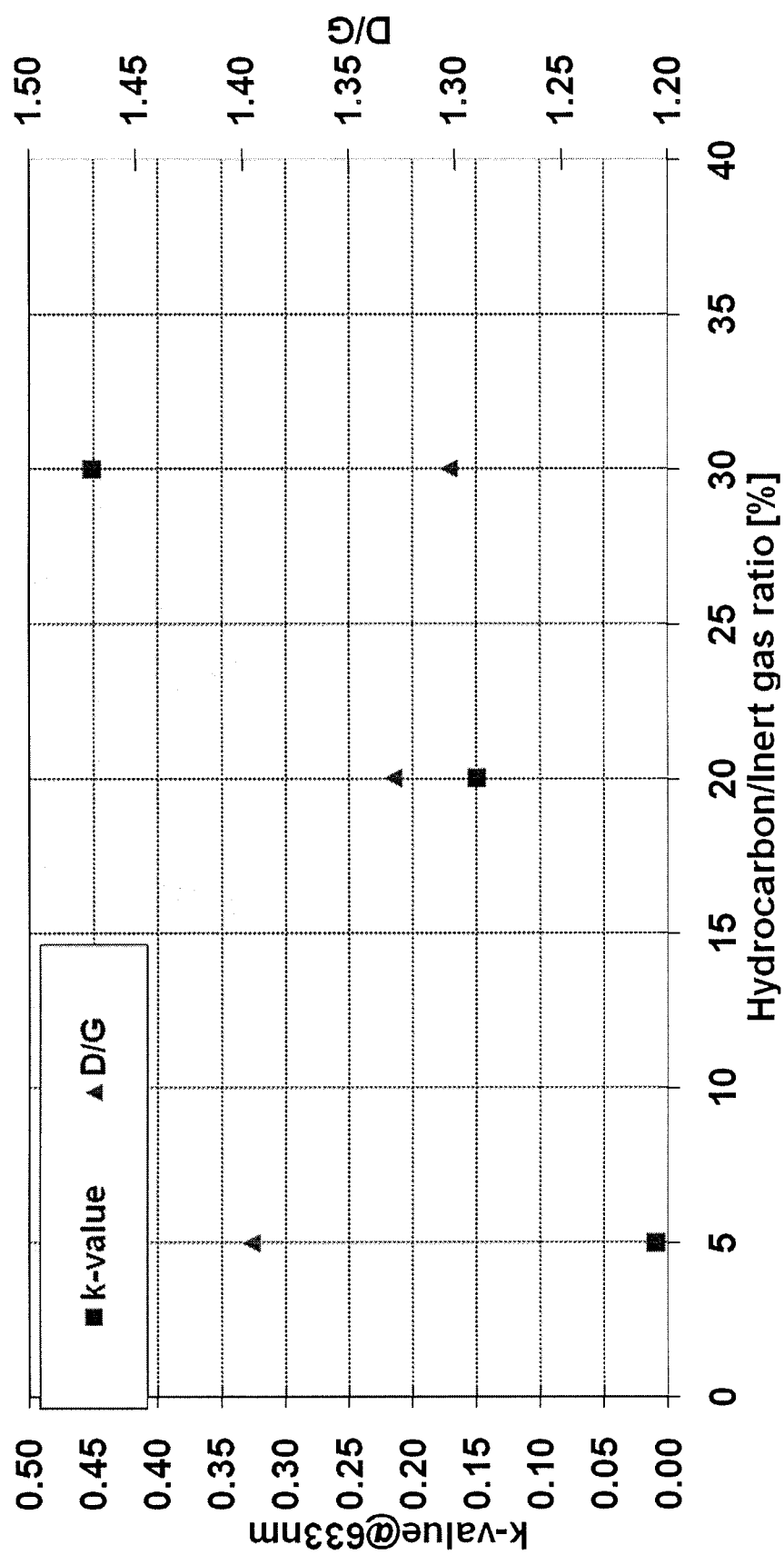
FIG. 4 is a graph showing an example of the relation between film optical properties and hydrocarbon/inert gas ratio, and the relation between bonding structure and hydrocarbon/inert gas ratio in embodiments of the present invention.

FIG. 4 also shows the relationship between the bonding structures of the formed carbon film and the hydrocarbon/inert gas ratio at a susceptor temperature of 340° C. The bonding structures of the carbon film are expressed as the D/G ratio which denotes a ratio of diamond-like structure (D) to graphite like bonding structures (G) which can be measured by RAMAN spectroscopy. A high D/G ratio is one of the important characteristics that can also influence the extinction coefficient. The D/G ratios measured in Example 3, Example 4-1, 4-2, and 4-3, and Example 5 are shown below:

| Example | Bonding structure (D/G) ratio |
|---|---|
| 3 | 1.33 |
| 4-1 | 1.30 |
| 4-2 | 1.37 |
| 4-3 | 1.40 |
| 5 | 1.30 |

As shown in FIG. 4, when the hydrocarbon/inert gas ratio is less than about 0.20 (20%) or less, the D/G ratio becomes about 1.35 or higher and the extinction coefficient becomes about 0.15 or less.

Figure 5:
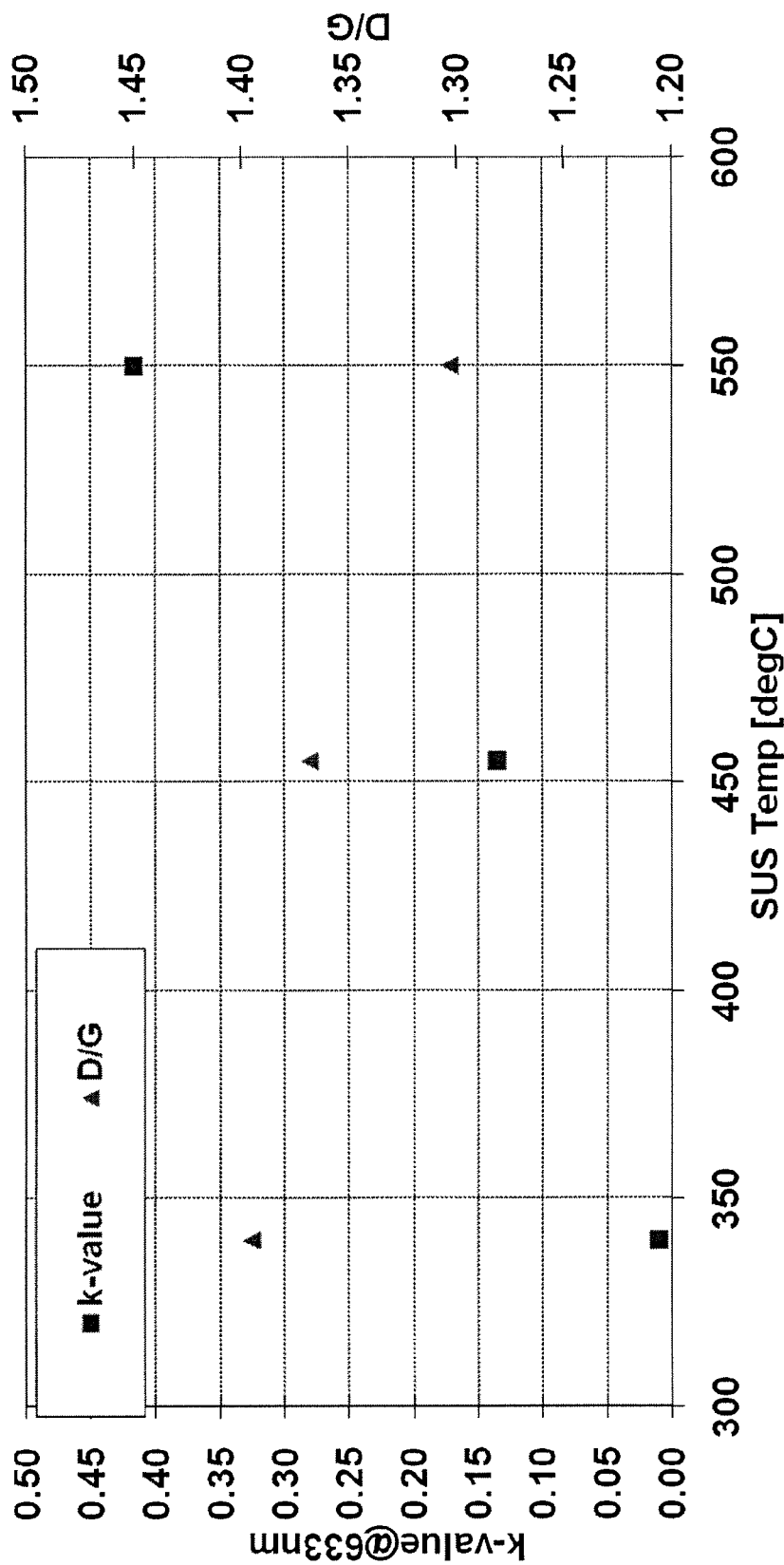
FIG. 5 is a graph showing an example of the relation between film optical properties and susceptor temperature, and the relation between bonding structure and susceptor temperature in embodiments of the present invention.

FIG. 5 shows the relationship between the D/G ratio and the susceptor temperature in Example 1-4 (where the hydrocarbon/inert gas ratio was 0.05 (5%)) in addition to the relationship between the extinction coefficients and the susceptor temperature. As shown in FIG. 5, when the susceptor temperature is about 450° C. or lower, the D/G ratio becomes about 1.35 or higher and the extinction coefficient becomes about 0.15 or less.

According to the embodiments the extinction coefficient (k) of the forming polymer film at a lighting optical wave length of 633 nm can be controlled from 0.005 to 0.1 at a lighting optical wave length of 633 nm, and a refractive index (n) of the forming polymer film can be controlled from 1.6 to 1.9. This may be because when the liquid monomer having a high C/H ratio is exposed to plasma, the state having a high C/H ratio can be maintained while forming a film, thereby increasing a density. Furthermore, the extinction coefficient decreases because it is strongly dependent on the deposition temperature. This maybe because when the temperature is reduced the film bonding structure is changed. More specifically, when reducing temperature more of diamond-like (sp3) bonds are formed that results in influencing the extinction coefficient. On the other hand when the temperature is increased more of the pure graphite-like (sp2) is developed which degrades the optical performances as a hardmask. Due to the high density and low extinction coefficient of the film, the etching selectivity and alignment performance can be improved.

The present invention includes the above mentioned embodiments and other various embodiments including the following:

1) A method of forming a highly transparent hydrocarbon-containing polymer film on a semiconductor substrate by a capacitively-coupled plasma CVD apparatus, which comprises: introducing a hydrocarbon-containing reactive gas ($C_\alpha H_\beta$, wherein α and β are natural numbers) into a CVD reaction chamber inside which a substrate is placed having a substrate temperature of below 400° C.; and forming a hydrocarbon-containing polymer film on said substrate by plasma polymerization of said gas.

2) The method according to 1), wherein the hydrocarbon-containing reactive gas is a hydrocarbon-containing liquid monomer ($C_\alpha H_\beta$, wherein α and β are natural numbers of 5 or more) having a boiling point of about 20° C. to about 350° C., said liquid monomer may be composed of only liquid monomer.

3) The method according to 1), wherein the substrate processing temperature is below 375° C.

4) The method according to 1), wherein the liquid monomer and inert gas ratio is of 0.5 or below.

5) The method according to 1), wherein the liquid monomer and inert gas ratio is of 0.2 or below.

6) The method according to 1), wherein the substrate processing pressure is below 1000 Pa.

7) The method according to 1), wherein the hydrocarbon-containing polymer film formed has the extinction coefficient of less than 0.1 at the lighting optical wavelength of 633 nm.

8) The method according to 1), wherein the inert gas is Ar, He, Ne, Kr, and/or N2; preferably He or/and Ar.

9) The method according to 1), wherein the plasma polymerization step is preformed under the conditions of: RF power density of approximately 0.01 W/cm$^2$-approximately 20 W/cm$^2$ (per substrate area).

10) The method according to 1), wherein a plasma polymerization step can be performed using a frequency exceeding 5 MHz, e.g., any one of high RF frequency power of 13.56 MHz, 27 MHz or 60 MHz.

11) The method according to 1), wherein a plasma polymerization step can be performed using a dual frequency; further, one of the foregoing high RF frequency power and low RF power of 5 MHz or less (including 2 MHz or less and 500 kHz or less) can be combined. In an embodiment, a ratio of low RF power is 50% or less, 30% or less, or 10% or less of high RF power.

12) The method according to 1), wherein the liquid monomer has a carbon/hydrogen ratio (C/H) of 0.5 or higher.

13) The method according to 1), wherein said liquid monomer is cyclic.

14) The method according to 1), wherein the liquid monomer is cyclopentane.

15) The method according to 1), wherein the liquid monomer is cyclopentene.

16) The method according to 1), wherein said liquid monomer is isoprene.

17) The method according to 1), wherein as an additive gas, an organic gas CnHm (wherein n is an integer of 4 or less including zero; m is any natural number) is further introduced into the reaction chamber.

18) The method according to 1), wherein as an additive gas, a dry gas containing any one or more or all of N, O, and F is further introduced into the reaction chamber.

19) The method according to 12), wherein the forming polymer film has a density of more than 1.0 g/cm$^3$.

20) The method according to 12), wherein the forming polymer film has a refractive index (n) of 1.6 or higher at a lighting optical wave length of 633 nm.

21) The method according to 1), wherein the forming polymer film is a hard mask.

It will be understood by those of skill in the art that numerous and various modifications can be made without departing from the spirit of the present invention. Therefore, it should be clearly understood that the forms of the present invention are illustrative only and are not intended to limit the scope of the present invention.

What is claimed is:

1. A method of forming a transparent hydrocarbon-based polymer film on a substrate by plasma CVD, comprising:

introducing a main gas consisting of a hydrocarbon gas ($C_\alpha H_\beta$, wherein α and β are natural numbers) and an inert gas at a flow ratio (R) of $C_\alpha H_\beta$/inert gas of 0.25 or less into a CVD reaction chamber inside which a substrate is placed, wherein the liquid monomer has a carbon/hydrogen ratio (C/H) of 0.5 or higher and has no benzene ring; and forming a hydrocarbon-based polymer film on the substrate by plasma polymerization of the gas at a processing temperature (T° C.) wherein T≦(−800R+500) and T<350, at a pressure of less than 1000 Pa, and at an RF power density of about 0.01 W/cm$^2$ to about 20 W/cm$^2$, wherein the flow ratio and the processing temperature are controlled, thereby forming the hydrocarbon-based polymer film having an extinction coefficient of 0.05 or less as measured at a lighting optical wavelength of 633 nm, a modulus of 20 GPa or higher, and a hardness of 4 GPa or higher.

2. The method according to claim 1, wherein the hydrocarbon gas is a gaseous phase of a hydrocarbon liquid monomer ($C_\alpha H_\beta$, wherein α and β are natural numbers of 5 or more) having a boiling point of about 20° C. to about 350° C.

3. The method according to claim 1, wherein the processing temperature is below 400° C.

4. The method according to claim 1, wherein the flow ratio is 0.2 or less.

5. The method according to claim 1, wherein the inert gas is Ar, He, Ne, Kr, and/or N2.

6. The method according to claim 2, wherein the liquid monomer is cyclic.

7. The method according to claim 6, wherein the liquid monomer is cyclopentane.

8. The method according to claim 6, wherein the liquid monomer is cyclopentene.

9. The method according to claim 6, wherein said liquid monomer is isoprene.

10. The method according to claim 1, wherein the step of introducing the main gas further comprises introducing as an additive gas an organic gas CnHm (wherein n is an integer of 4 or less including zero; m is any natural number) into the reaction chamber.

11. The method according to claim 1, wherein the step of introducing the main gas further comprises introducing as an additive gas a dry gas containing any one or more or all of N, O, and F is into the reaction chamber.

12. The method according to claim 1, wherein the forming polymer film has a density of more than 1.0 g/cm$^3$.

13. The method according to claim 1, wherein the forming polymer film has a refractive index (n) of 1.6 or higher at a lighting optical wave length of 633 nm.

14. The method according to claim 1, wherein the forming polymer film is formed on the substrate as a hard mask.

* * * * *

UNITED STATES PATENT AND TRADEMARK OFFICE
CERTIFICATE OF CORRECTION

PATENT NO. : 7,632,549 B2  Page 1 of 1
APPLICATION NO. : 12/115386
DATED : December 15, 2009
INVENTOR(S) : Kamal Kishore Goundar It is certified that error appears in the above-identified patent and that said Letters Patent is hereby corrected as shown below:

At column 7, line 17, please change "$CH_2$—$C(CH_3)$" to --$CH_2=C(CH_3)$--.
At column 8, line 51, please change "W/cm2," to --$W/cm^2$,--.
At column 10, line 65, after "4-1" insert --:--.
At column 10, line 66, please change "C." to --C:--.
At column 11, line 6, after "4-2" insert --:--.
At column 11, line 7, please change "C." to --C:--.
At column 11, line 14, after "4-3" insert --:--.
At column 11, line 15, please change "C." to --C:--.

Signed and Sealed this

Eighteenth Day of May, 2010

David J. Kappos
*Director of the United States Patent and Trademark Office*